(12) United States Patent
Koh et al.

(10) Patent No.: US 9,441,111 B2
(45) Date of Patent: Sep. 13, 2016

(54) COMPOSITION FOR ENCAPSULANT, ENCAPSULANT, AND ELECTRONIC ELEMENT

(71) Applicant: CHEIL INDUSTRIES INC., Gumi-si, Gyeongsangbuk-do (KR)

(72) Inventors: Sang-Ran Koh, Suwon-si (KR); Woo-Han Kim, Suwon-si (KR); Chang-Soo Woo, Suwon-si (KR); Ha-Neul Kim, Suwon-si (KR); Chi-Won An, Suwon-si (KR); Eun-Seon Lee, Suwon-si (KR)

(73) Assignee: CHEIL INDUSTRIES, INC., Gumi-si, Gyeongsangbuk-do (KR)

( * ) Notice: Subject to any disclaimer, the term of this patent is extended or adjusted under 35 U.S.C. 154(b) by 0 days.

(21) Appl. No.: 14/653,605

(22) PCT Filed: Nov. 29, 2013

(86) PCT No.: PCT/KR2013/010977
§ 371 (c)(1),
(2) Date: Jun. 18, 2015

(87) PCT Pub. No.: WO2014/104598
PCT Pub. Date: Jul. 3, 2014

(65) Prior Publication Data
US 2015/0299464 A1   Oct. 22, 2015

(30) Foreign Application Priority Data
Dec. 26, 2012 (KR) .......................... 10-2012-0153559

(51) Int. Cl.
| | |
|---|---|
| H01L 23/29 | (2006.01) |
| C08L 83/14 | (2006.01) |
| C08L 83/04 | (2006.01) |
| H01L 33/54 | (2010.01) |
| H01L 33/56 | (2010.01) |
| C08G 77/12 | (2006.01) |
| C08G 77/20 | (2006.01) |
| C08G 77/50 | (2006.01) |

(52) U.S. Cl.
CPC ............... *C08L 83/14* (2013.01); *C08L 83/04* (2013.01); *H01L 23/296* (2013.01); *H01L 33/54* (2013.01); *C08G 77/12* (2013.01); *C08G 77/20* (2013.01); *C08G 77/50* (2013.01); *C08L 2203/206* (2013.01); *H01L 33/56* (2013.01); *H01L 2224/48091* (2013.01)

(58) Field of Classification Search
None
See application file for complete search history.

(56) References Cited

U.S. PATENT DOCUMENTS

| | | | |
|---|---|---|---|
| 2012/0157624 A1 | 6/2012 | Saito | |
| 2015/0144987 A1* | 5/2015 | Hamamoto | ............. C08L 83/04 257/100 |

FOREIGN PATENT DOCUMENTS

| | | | |
|---|---|---|---|
| JP | 06-080677 A | 3/1994 | |
| JP | 2008-210845 A | 9/2008 | |
| JP | 2011-042732 A | 3/2011 | |
| JP | 2012-188655 A | 10/2012 | |
| KR | 10-1030019 B1 | 4/2011 | |
| KR | 10-2011-0121151 A | 11/2011 | |
| KR | 10-2012-0115142 A | 10/2012 | |
| KR | 10-2012-0120005 A | 11/2012 | |
| WO | WO 2004/048443 | * 6/2004 | |

OTHER PUBLICATIONS

"Metathesis of Vinyl-Substituted Silicon Compounds with Dienes and Cycloalkenes" authored by Pietraszuk et al. and published in Adv. Synth. Cataly. (2002) 344, 6-7, 789-793.*
"Synthesis and Structural Characterization of trans-tactic Siloxylene Vinylene-p-Phenylene Polymers via ADMET Copolymerization and Silylative Coupling (SC) Polycondensation" authored by Marciniec et al. and published in J. Organomet. Chem. (2003), 686, 228-234.*

* cited by examiner

*Primary Examiner* — Marc Zimmer
(74) *Attorney, Agent, or Firm* — Lee & Morse, P.C.

(57) ABSTRACT

Disclosed are a composition for an encapsulant that includes a first polysiloxane including a moiety represented by Chemical Formula 1 and an alkenyl group bound to silicon (Si—Vi) at the terminal end and a second polysiloxane including hydrogen bound to silicon (Si—H) at the terminal end, an encapsulant obtained by curing the composition for an encapsulant, and an electronic element including the encapsulant.

9 Claims, 1 Drawing Sheet

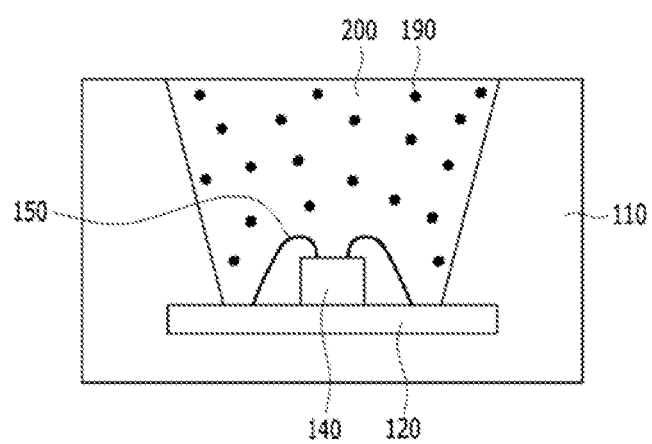

COMPOSITION FOR ENCAPSULANT, ENCAPSULANT, AND ELECTRONIC ELEMENT

TECHNICAL FIELD

A composition for an encapsulant, an encapsulant, and an electronic element are disclosed.

BACKGROUND ART

A light emitting device such as a light emitting diode (LED), an organic light emitting diode device (OLED), and a photoluminescence (PL) device has been variously applied to a domestic electric device, a lighting device, a display device, various automatic devices, and the like.

The light emitting device may display intrinsic colors of a light emitting material such as blue, red, and green in a light emission part, or white by combining light emitters displaying different colors.

Such a light emitting device may generally include an encapsulant having a packaging or encapsulation structure. Such an encapsulant may be made of a composition for an encapsulant that is a transparent resin being able to externally pass light emitted from a light emission part.

DISCLOSURE

Technical Problem

One embodiment provides a composition for an encapsulant capable of improving reliability of an encapsulant.

Another embodiment provides an encapsulant obtained by curing the composition for an encapsulant.

Yet another embodiment provides an electronic element including the encapsulant.

Technical Solution

According to one embodiment, provided is a composition for an encapsulant that includes a first polysiloxane including a moiety represented by Chemical Formula 1 and an alkenyl group bound to silicon (Si—Vi) at the terminal end and a second polysiloxane including hydrogen bound to silicon (Si—H) at the terminal end.

[Chemical Formula 1]

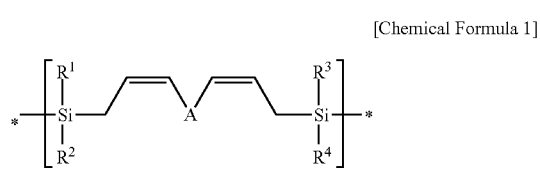

In Chemical Formula 1,

A is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, and $R^1$ to $R^4$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof.

The A may be a substituted or unsubstituted C6 to C20 arylene group.

The second polysiloxane may be represented by Chemical Formula 2.

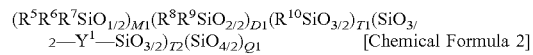  [Chemical Formula 2]

In Chemical Formula 2, $R^5$ to $R^{10}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^5$ to $R^{10}$ includes hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, 0<M1<1, 0≤D1<1, 0≤T1<1, 0≤T2<1, 0≤Q1<1, and M1+D1+T1+T2+Q1=1.

The first polysiloxane may be included in an amount of about 10 to 80 wt % based on the total amount of the composition for an encapsulant, and the second polysiloxane may be included in an amount of about 20 to 90 wt % based on the total amount of the composition for an encapsulant.

The composition for an encapsulant may further include a third polysiloxane represented by Chemical Formula 3.

$(R^{11}R^{12}R^{13}SiO_{1/2})_{M2}(R^{14}R^{15}SiO_{2/2})_{D2}(R^{16}SiO_{3/2})_{T3}$
$(SiO_{3/2}—Y^2—SiO_{3/2})_{T4}(SiO_{4/2})_{Q2}$  [Chemical Formula 3]

In Chemical Formula 3, $R^{11}$ to $R^{16}$ are independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{11}$ to $R^{16}$ includes a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M2<1$, $0 \leq D2<1$, $0 \leq T3<1$, $0 \leq T4<1$, $0 \leq Q2<1$, and $M2+D2+T3+T4+Q2=1$.

At least one of T3 and T4 of Chemical Formula 3 may not 0.

The first polysiloxane may be included in an amount of about 10 to 50 wt % based on the total amount of the composition for an encapsulant, the second polysiloxane may be included in an amount of about 20 to 60 wt % based on the total amount of the composition for an encapsulant, and the third polysiloxane may be included in an amount of about 30 to 70 wt % based on the total amount of the composition for an encapsulant.

According to another embodiment, an encapsulant obtained by curing the composition for an encapsulant is provided.

According to yet another embodiment, an electronic element including the encapsulant is provided.

Advantageous Effects

Heat resistance of an encapsulant increases and moisture permeability and oxygen permeability is lowered and thus reliability of an encapsulant may be improved.

DESCRIPTION OF DRAWINGS

FIG. 1 is a schematic cross-sectional view of a light emitting diode according to one embodiment.

BEST MODE

Exemplary embodiments of the present invention will hereinafter be described in detail, and may be easily performed by those who have common knowledge in the related art. However, this disclosure may be embodied in many different forms and is not construed as limited to the exemplary embodiments set forth herein.

In this specification, when a definition is not otherwise provided, 'substituted' refers to one substituted with at least a substituent selected from a halogen atom (F, Cl, Br, or I), a hydroxy group, an alkoxy group, a nitro group, a cyano group, an amino group, an azido group, an amidino group, a hydrazino group, a hydrazono group, a carbonyl group, a carbamyl group, a thiol group, ester group, a carboxyl group or a salt thereof, a sulfonic acid group or a salt thereof, phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound.

In this specification, when a definition is not otherwise provided, 'hetero' refers to one including 1 to 3 heteroatoms selected from N, O, S, and P.

Hereinafter, a composition for an encapsulant according to one embodiment is described.

A composition for an encapsulant according to one embodiment includes a first polysiloxane including a moiety represented by Chemical Formula 1 and an alkenyl group bound to silicon (Si—Vi) at the terminal end and a second polysiloxane including hydrogen bound to silicon (Si—H) at the terminal end.

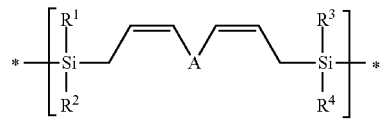

[Chemical Formula 1]

In Chemical Formula 1,

A is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, and $R^1$ to $R^4$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof.

* indicates a point linked to another element of the first polysiloxane.

The first polysiloxane may include repetitively arranged siloxane moieties of a chain structure, a reticular structure or a mixed structure thereof and include a moiety represented by Chemical Formula 1 in the structure.

The first polysiloxane may increase cross-linking reactivity in an alkenylene group positioned between silicon (Si) and silicon (Si) during the curing due to the moiety represented by Chemical Formula 1, and thus, cross-linking density of an encapsulant. In this way, when the cross-linking density of the encapsulant is increased, the encapsulant may play a role of buffering against a volume change according to thermal expansion and thus, prevent a crack on the surface or detachment from a lower layer as well as improve heat resistance. In addition, moisture permeability and oxygen permeability may be remarkably improved by increasing the number of a silicon (Si)-carbon (C) bond in the encapsulant during the curing, applying hydrophobicity on the surface, and decreasing moisture and/or gas inflowing from the outside. Accordingly, reliability of an encapsulant may be improved.

The first polysiloxane has an alkenyl group bound to silicon (Si—Vi). The alkenyl group bound to silicon (Si—Vi) may perform a hydrosilylation reaction with a second polysiloxane which will be described later.

One or more kinds of the first polysiloxane may be used.

A weight average molecular weight of the first polysiloxane may be about 100 to 30,000 g/mol, or about 100 to 10,000 g/mol within the range.

The second polysiloxane may be represented by Chemical Formula 2.

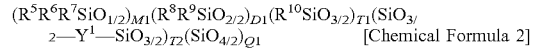

[Chemical Formula 2]

In Chemical Formula 2, $R^5$ to $R^{10}$ are independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^5$ to $R^{10}$ includes hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M1<1$, $0 \le D1<1$, $0 \le T2<1$, $0 \le T2<1$, $0 \le Q1<1$, and
$M1+D1+T1+T2+Q1=1$.

The second polysiloxane is a compound having hydrogen bound to silicon (Si—H) at the terminal end, and for example may include two or more hydrogen bound to silicon (Si—H) per molecule in average. The hydrogen bound to silicon (Si—H) may react with the alkenyl group positioned at the terminal end of the first polysiloxane and/or the alkenyl group positioned at the terminal end of the third polysiloxane that will be described later.

The second polysiloxane may have a chain structure, a reticular structure and/or a mixed structure thereof.

The second polysiloxane may be, for example obtained by hydrolysis and condensation polymerization of a monomer represented by $R^5R^6R^7SiZ^1$ and at least one selected from a monomer represented by $R^8R^9SiZ^2Z^3$, a monomer represented by $R^{10}SiZ^4Z^5Z^6$, a monomer represented by $Z^7Z^8Z^9Si-Y^1-SiZ^{10}Z^{11}Z^{12}$, and a monomer represented by $SiZ^{13}Z^{14}Z^{15}Z^{16}$. Herein, $R^5$ to $R^{19}$ and $Y^1$ are the same as defined above, and $Z^1$ to $Z^{16}$ are independently a C1 to C6 alkoxy group, a hydroxy group, a halogen, a carboxyl group, or a combination thereof.

One or more kinds of the second polysiloxane may be used.

A weight average molecular weight of the second polysiloxane may be about 100 to 30,000 g/mol, or about 100 to 10,000 g/mol within the range.

The first polysiloxane may be included in an amount of about 10 to 80 wt % based on the total amount of the composition for an encapsulant, and the second polysiloxane may be included in an amount of about 20 to 90 wt % based on the total amount of the composition for an encapsulant.

The composition for an encapsulant may further include a third polysiloxane represented by Chemical Formula 3.

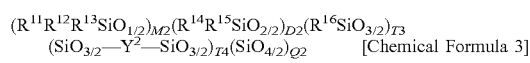
[Chemical Formula 3]

In Chemical Formula 3, $R^{11}$ to $R^{16}$ are independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^{11}$ to $R^{16}$ includes a substituted or unsubstituted C2 to C30 alkenyl group, $Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M2<1$, $0 \le D2<1$, $0 \le T3<1$, $0 \le T4<1$, $0 \le Q2<1$, and
$M2+D2+T3+T4+Q2=1$.

The third polysiloxane is a compound having an alkenyl group bound to silicon (Si—Vi) at the terminal end, and for example may include two or more alkenyl group bound to silicon (Si—Vi) in average. The alkenyl group bound to silicon (Si—Vi) may react with hydrogen positioned at the terminal end of the second polysiloxane.

The third polysiloxane may have a chain structure, reticular structure and/or a mixed structure thereof, for example a reticular structure. When the third polysiloxane has a reticular structure, at least one of T3 and T4 may not 0.

The third polysiloxane may be, for example obtained by hydrolysis and condensation polymerization of a monomer represented by $R^{11}R^{12}R^{13}SiZ^{17}$ and at least one selected from a monomer represented by $R^{14}R^{15}SiZ^{18}Z^{19}$, a monomer represented by $R^{16}SiZ^{20}Z^{21}Z^{22}$, a monomer represented by $Z^{23}Z^{24}Z^{25}Si-Y^2-SiZ^{26}Z^{27}Z^{28}$, and a monomer represented by $SiZ^{29}Z^{30}Z^{31}Z^{32}$. Herein, $R^{11}$ to $R^{16}$ and $Y^2$ are the same as defined above, and $Z^{17}$ to $Z^{32}$ are each independently a C1 to C6 alkoxy group, a hydroxy group, a halogen, a carboxyl group, or a combination thereof.

One or more kinds of the third polysiloxane may be used.

A weight average molecular weight of the third polysiloxane may be about 100 to 30,000 g/mol, or about 100 to 10,000 g/mol within the range.

The first polysiloxane may be included in an amount of about 10 to 50 wt % based on the total amount of the composition for an encapsulant, the second polysiloxane may be included in an amount of about 20 to 60 wt % based on the total amount of the composition for an encapsulant, and the third polysiloxane may be included in an amount of about 30 to 70 wt % based on the total amount of the composition for an encapsulant.

The composition for an encapsulant may further include a filler.

The filler may be made of inorganic oxide, for example silica, alumina, titanium oxide, zinc oxide, or a combination thereof.

The composition for an encapsulant may further include a hydrosilylation catalyst.

The hydrosilylation catalyst may accelerate hydrosilylation reactions of the first polysiloxane, the second polysiloxane and the third polysiloxane, and it may include, for example platinum, rhodium, palladium, ruthenium, iridium, or a combination thereof.

The hydrosilylation catalyst may be included in an amount of about 0.1 ppm to 1000 ppm based on the total amount of the composition for an encapsulant.

The composition for an encapsulant may be cured by be heat-treated at a predetermined temperature and thus may be used as an encapsulant.

The encapsulant may be applied to an electronic element for example a light emitting diode and an organic light emitting device.

Hereinafter, as an example of an electronic element to which the encapsulant is applied, a light emitting diode according to one embodiment is described referring to FIG. 1.

FIG. 1 is a schematic cross-sectional view of a light emitting diode according to one embodiment.

Referring to FIG. 1, the light emitting diode includes a mold 110; a lead frame 120 disposed inside the mold 110; a light emitting diode chip 140 mounted on the lead frame 120; a bonding wire 150 connecting the lead frame 120 to the light emitting diode chip 140; and an encapsulant 200 covering the light emitting diode chip 140.

The encapsulant 200 is obtained by curing the composition for an encapsulant.

A phosphor 190 may be dispersed in the encapsulant 200. The phosphor 190 includes a material stimulated by light and emitting light in an intrinsic wavelength range and largely, a quantum dot such as a semiconductor nanocrystal. The phosphor 190 may include for example a blue phosphor, a green phosphor, a red phosphor, or a mixture of more than two thereof.

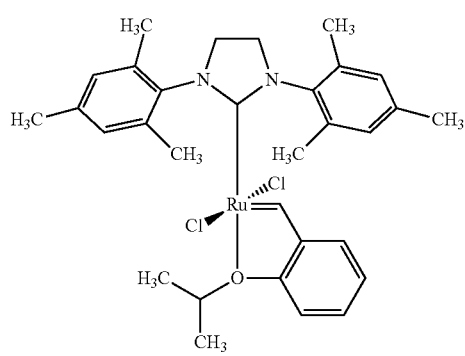

[Chemical Formula A]

The phosphor 190 may display an image in a predetermined wavelength region by light supplied from the light emitting diode chip 140 as a light emission part, and herein, the light emitting diode chip 140 may display a color in a shorter wavelength region than a color displayed in the phosphor 190. For example, when the phosphor 190 displays red, the light emitting diode chip 140 may supply blue or green in a shorter wavelength region than that of the red.

In addition, the color from the light emitting diode chip 140 and the color form the phosphor 190 may be combined and display white. For example, when the light emitting diode chip 140 supplies blue light, and the phosphor 190 includes a red phosphor and a green phosphor, the electronic element may combine blue, red, and green and thus, display white.

The phosphor 190 may be omitted.

MODE FOR INVENTION

Hereinafter, the present disclosure is illustrated in more detail with reference to examples. However, these examples are exemplary, and the present disclosure is not limited thereto.

SYNTHESIS OF FIRST POLYSILOXANE

Synthesis Example 1

300 g of a mixture of divinylbenzene and vinyl terminated polyphenylmethylsiloxane (PMV-9925, Gelest) in a mole ratio of 1:1 was put in a 3-necked flask while the flask was maintained at 23° C., and 0.1 g of a catalyst represented by Chemical Formula A (Hoveyda-Grubbs Catalyst, $2^{nd}$ generation. Aldrich) was added thereto. Subsequently, the obtained mixture was heated and refluxed at 160° C. for 3 hours to perform a Cross Methathesis polymerization reaction. Subsequently, the resultant was cooled down to room temperature and then, filtered to remove the catalyst, obtaining polysiloxane represented by Chemical Formula 4.

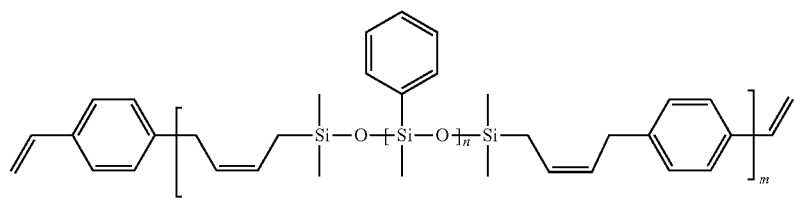

[Chemical Formula 4]

When the molecular weight of the obtained polysiloxane was measured by using gel permeation chromatography, its molecular weight reduced to polystyrene was 8,000 g/mol.

Synthesis Example 2

Polysiloxane was synthesized according to the same method as Synthesis Example 1 except for mixing divinylbenzene and vinyl terminated polyphenylmethylsiloxane (PMV-9925, Gelest) in a mole ratio of 1.5:1.

When the molecular weight of the obtained polysiloxane was measured by using gel permeation chromatography, its molecular weight reduced to polystyrene was 7,000 g/mol.

Synthesis Example 3

Polysiloxane was synthesized according to the same method as Synthesis Example 1 except for mixing divinylbenzene and vinyl terminated polyphenylmethylsiloxane (PMV-9925, Gelest) in a mole ratio of 2:1.

When the molecular weight of the polysiloxane was measured by using gel permeation chromatography, its molecular weight reduced to polystyrene was 6,000 g/mol.

SYNTHESIS OF SECOND POLYSILOXANE

Synthesis Example 4

1 kg of a mixed solvent obtained by mixing water and toluene in a weight ratio of 5:5 was put in a 3-necked flask while the flask was maintained at 23° C., and a mixture of 6.72 g of diphenyldichlorosilane and 159.39 g of tetramethyldisiloxane was added thereto in a dropwise fashion over 2 hours. When the addition was complete, the obtained mixture was heated at 20° C. for 3 hours to perform a condensation polymerization reaction. Subsequently, the resultant was cooled down to room temperature, an aqueous layer was removed therefrom, preparing a siloxane solution in which siloxane was dissolved in toluene. The obtained siloxane solution was washed with water to remove chlorine of a side product. Subsequently, the neutral siloxane solution was distillated under a reduced pressure to remove the toluene, obtaining polysiloxane represented by Chemical Formula 2a.

$(Me_2HSiO_{1/2})_{0.1}(Ph2SiO_{2\,1\,2})_{0.9}$ [Chemical Formula 2a]

(Me: a methyl group, Ph: a phenyl group)

When the molecular weight of the compound was measured by using gel permeation chromatography, its molecular weight reduced to polystyrene was 334 g/mol.

SYNTHESIS OF THIRD POLYSILOXANE

Synthesis Example 5

1 kg of a mixed solvent obtained by mixing water and toluene in a weight ratio of 5:5 was put in a 3-necked flask, while the flask was maintained at 23° C., and 300 g of a mixture of phenyltrichlorosilane, bis(trichlorosilyl)methane and vinyldimethylchlorosilane in a mole ratio of 85:5:10 was added thereto in a dropwise fashion over 2 hours. When the addition was complete, the obtained mixture was heated and refluxed at 90° C. for 3 hours to perform a condensation polymerization reaction. Subsequently, the resultant was cooled down to room temperature, and an aqueous layer was removed therefrom, manufacturing a polymer solution in which the polymer was dissolved in toluene. The obtained polymer solution was washed with water to remove chlorine of a reaction side-product. Subsequently, the neutral polymer solution was distillated under a reduced pressure to remove the toluene, obtaining polysiloxane represented by Chemical Formula 3a.

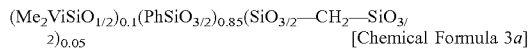

$(Me_2ViSiO_{1/2})_{0.1}(PhSiO_{3/2})_{0.85}(SiO_{3/2}-CH_2-SiO_{3/2})_{0.05}$ [Chemical Formula 3a]

(Me: a methyl group, Vi: a vinyl group, Ph: a phenyl group)

The molecular weight of the obtained compound was measured by using gel permeation chromatography, and its molecular weight reduced to polystyrene was 1900 g/mol.

PREPARATION OF COMPOSITION FOR ENCAPSULANT

Example 1

23 wt % of the polysiloxane compound according to Synthesis Example 1, 25 wt % of the polysiloxane compound according to Synthesis Example 4, 52 wt % of the polysiloxane compound according to Synthesis Example 5, and a hydrosilylation catalyst, Pt—CS 2.0 (Umicore) (added up to a Pt content of 5 ppm) were mixed and foam-removed under vacuum, to prepare a composition for an encapsulant.

Example 2

23 wt % of the polysiloxane compound according to Synthesis Example 2, 25 wt % of the polysiloxane compound according to Synthesis Example 4, 52 wt % of the polysiloxane compound according to Synthesis Example 5, and a hydrosilylation catalyst, Pt—CS 2.0 (Umicore) (added up to a Pt content of 5 ppm) were mixed and foam-removed under vacuum, to prepare a composition for an encapsulant.

Example 3

23 wt % of the polysiloxane compound according to Synthesis Example 3, 25 wt % of the polysiloxane compound according to Synthesis Example 4, 52 wt % of the polysiloxane compound according to Synthesis Example 5, and a hydrosilylation catalyst, Pt—CS 2.0 (Umicore) (added up to a Pt content of 5 ppm) were mixed and foam-removed under vacuum, to prepare a composition for an encapsulant.

Example 4

15 wt % of the polysiloxane compound according to Synthesis Example 3, 25 wt % of the polysiloxane compound according to Synthesis Example 4, 52 wt % of the polysiloxane compound according to Synthesis Example 5, 8 wt % of polyphenylmethylsiloxane (PMV-9925, Gelest), and a hydrosilylation catalyst, Pt—CS 2.0 (Umicore) (added up to a Pt content of 5 ppm) were mixed and foam-removed under vacuum, to prepare a composition for an encapsulant.

Example 5

15 wt % of the polysiloxane compound according to Synthesis Example 2, 25 wt % of the polysiloxane compound according to Synthesis Example 4, 52 wt % of the polysiloxane compound according to Synthesis Example 5, 8 wt % of polyphenylmethylsiloxane (PMV-9925, Gelest), and a hydrosilylation catalyst, Pt—CS 2.0 (Umicore) (added up to a Pt content of 5 ppm) were mixed and foam-removed under vacuum, to prepare a composition for an encapsulant.

Comparative Example 1

25 wt % of the polysiloxane compound according to Synthesis Example 4, 52 wt % of the polysiloxane compound according to Synthesis Example 5, 23 wt % of polyphenylmethylsiloxane (PMV-9925, Gelest), and a hydrosilylation catalyst, Pt—CS 2.0 (Umicore) (added up to a Pt content of 5 ppm) were mixed and foam-removed under vacuum, to prepare a composition for an encapsulant.

Evaluation

Transmittance, heat resistance, a coefficient of thermal expansion and a delamination rate of the compositions for an encapsulant according to Examples 1 to 5 and Comparative Example 1 were evaluated.

The transmittance was measured by preparing cured specimens having each thickness of 1 mm using the by compositions for an encapsulant according to Examples 1 to 5 and Comparative Example 1, and curing the same at 150° C. for 2 hours, and then using UV-spectrophotometer (Shimazu Corporation UV-3600) in a wavelength of 600 nm.

The heat resistance was evaluated as a transmittance degradation rate, and then, the transmittance was measured after heat-treating the cured specimen at 120° C. for 1000 hours.

The coefficient of thermal expansion was measured by using a specimen (1 cm×1 cm×0.4 cm) obtained by curing the compositions for an encapsulant according to Examples 1 to 5 and Comparative Example 1 and a TMA equipment made by TA Instruments.

The delamination rate was obtained by respectively dispensing the compositions for an encapsulant according to Examples 1 to 5 and Comparative Example 1 into 7030PKG (a LED package), thermally curing them, connecting the LED package to PCB, putting the assembled PCB in a T/C equipment, 100 times alternatively repeating 15 minutes at −45° C. and 15 minutes at 125° C. to apply a thermal impact thereto, sending an electric current to the PCB and then, counting how many were lighted.

The results are provided in Table 1.

TABLE 1

|  | Example 1 | Example 2 | Example 3 | Example 4 | Example 5 | Comparative Example 1 |
|---|---|---|---|---|---|---|
| Initial transmittance (%) | 98 | 98 | 98 | 98 | 98 | 96 |
| Transmittance (%) after heat treatment at 120° C. for 1000 hours | 94 | 94 | 95 | 95 | 95 | 90 |
| Transmittance degradation rate (%) | 4 | 4 | 3 | 3 | 3 | 7 |
| Coefficient of thermal expansion (CTE, ppm) | 85 | 86 | 82 | 90 | 95 | 100 |
| Delamination rate (%) after 100 times' thermal impact | 7 | 6 | 3 | 5 | 7 | 15 |

Referring to Table 1, the compositions for an encapsulant according to Examples 1 to 4 showed a remarkably deteriorated transmittance degradation rate after allowed to stand at a high temperature for a long term compared with the composition for an encapsulant according to Comparative Example 1. In addition, the compositions for an encapsulant according to Examples 1 to 4 showed remarkably improved coefficient of thermal expansion and delamination rate after applying a thermal impact compared with the composition for an encapsulant according to Comparative Example 1. Accordingly, the compositions for an encapsulant according to Examples 1 to 4 showed improved reliability.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

The invention claimed is:

1. A composition for an encapsulant, the composition comprising a first polysiloxane including a moiety represented by Chemical Formula 1 and an alkenyl group bound to silicon (Si—Vi) at a terminal end thereof, and a second polysiloxane including hydrogen bound to silicon (Si—H) at a terminal end thereof:

[Chemical Formula 1]

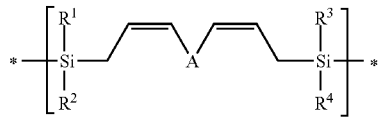

wherein, in Chemical Formula 1,

A is a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, and $R^1$ to $R^4$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof.

2. The composition for an encapsulant of claim 1, wherein A is a substituted or unsubstituted C6 to C20 arylene group.

3. The composition for an encapsulant of claim 1, wherein the second polysiloxane is represented by Chemical Formula 2:

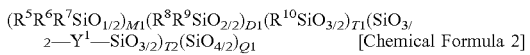
[Chemical Formula 2]

wherein, in Chemical Formula 2, $R^5$ to $R^{10}$ are each independently hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof, at least one of $R^5$ to $R^{10}$ is hydrogen, $Y^1$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof, $0<M1<1$, $0<D1<1$, $0<T1<1$, $0<T2<1$, $0<Q1<1$, and $M1+D1+T1+T2+Q1=1$.

4. The composition for an encapsulant of claim 1, wherein:
the first polysiloxane is included in an amount of 10 to 80 wt %, based on a total weight of the composition for an encapsulant, and
the second polysiloxane is included in an amount of 20 to 90 wt %, based on the total weight of the composition for an encapsulant.

5. The composition for an encapsulant of claim 1, further comprising a third polysiloxane represented by Chemical Formula 3:

$(R^{11}R^{12}R^{13}SiO_{1/2})_{M2}(R^{14}R^{15}SiO_{2/2})_{D2}(R^{16}SiO_{3/2})_{T3}$
$(SiO_{3/2}-Y^2-SiO_{3/2})_{T4}(SiO_{4/2})_{Q2}$ [Chemical Formula 3]

wherein, in Chemical Formula 3,
$R^{11}$ to $R^{16}$ are each independently substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C1 to C30 carbonyl group, a hydroxy group, or a combination thereof,
at least one of $R^{11}$ to $R^{16}$ is a substituted or unsubstituted C2 to C30 alkenyl group,
$Y^2$ is a single bond, a substituted or unsubstituted C1 to C20 alkylene group, a substituted or unsubstituted C3 to C20 cycloalkylene group, a substituted or unsubstituted C6 to C20 arylene group, a substituted or unsubstituted C2 to C20 heteroarylene group, a substituted or unsubstituted C2 to C20 alkenylene group, a substituted or unsubstituted C2 to C20 alkynylene group, or a combination thereof,
0<M2<1, 0<D2<1, 0<T3<1, 0<T4<1, 0<Q2<1, and M2+D2+T3+T4+Q2=1.

6. The composition for an encapsulant of claim 5, wherein at least one of T3 and T4 of Chemical Formula 3 is not 0.

7. The composition for an encapsulant of claim 5, wherein:
the first polysiloxane is included in an amount of 10 to 50 wt %, based on a total weight of the composition for an encapsulant,
the second polysiloxane is included in an amount of 20 to 60 wt %, based on the total weight of the composition for an encapsulant, and
the third polysiloxane is included in an amount of 30 to 70 wt %, based on the total weight of the composition for an encapsulant.

8. An encapsulant obtained by curing the composition for an encapsulant of claim 1.

9. An electronic element comprising the encapsulant of claim 8.

* * * * *